(12) United States Patent
Aniruddhan et al.

(10) Patent No.: US 8,929,840 B2
(45) Date of Patent: *Jan. 6, 2015

(54) LOCAL OSCILLATOR BUFFER AND MIXER HAVING ADJUSTABLE SIZE

(75) Inventors: Sankaran Aniruddhan, San Diego, CA (US); Chiewcharn Narathong, Laguna Niguel, CA (US); Sriramgopal Sridhara, San Diego, CA (US); Ravi Sridhara, San Diego, CA (US); Gurkanwal Singh Sahota, San Diego, CA (US); Frederic Bossu, San Diego, CA (US); Ojas M. Choksi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1109 days.

This patent is subject to a terminal disclaimer.

(21) Appl. No.: 12/209,164

(22) Filed: Sep. 11, 2008

(65) Prior Publication Data
US 2009/0075620 A1    Mar. 19, 2009

Related U.S. Application Data

(63) Continuation-in-part of application No. 11/855,997, filed on Sep. 14, 2007, now Pat. No. 7,941,115, and a continuation-in-part of application No. 11/955,201, filed on Dec. 12, 2007, now Pat. No. 8,019,310.

(60) Provisional application No. 60/983,879, filed on Oct. 30, 2007.

(51) Int. Cl.
| | |
|---|---|
| H04B 1/02 | (2006.01) |
| H04B 1/06 | (2006.01) |
| H04B 7/00 | (2006.01) |
| H04B 1/26 | (2006.01) |
| H03D 7/16 | (2006.01) |
| H03D 7/14 | (2006.01) |
| H03G 3/30 | (2006.01) |

(52) U.S. Cl.
CPC ............ *H03D 7/166* (2013.01); *H03D 7/1441* (2013.01); *H03G 3/3052* (2013.01); *H03D 7/1483* (2013.01); *H03D 7/165* (2013.01); *H03D 2200/0025* (2013.01)
USPC .......... 455/91; 455/118; 455/147; 455/236.1; 455/258; 455/318

(58) Field of Classification Search
USPC ............ 455/118, 255–262, 313–326, 333, 91
See application file for complete search history.

(56) References Cited

U.S. PATENT DOCUMENTS

| | | | |
|---|---|---|---|
| 3,212,024 A | 10/1965 | King, Jr. | |
| 3,212,027 A | 10/1965 | Ko | |

(Continued)

FOREIGN PATENT DOCUMENTS

| | | |
|---|---|---|
| CN | 1136741 A | 11/1996 |
| CN | 1207835 A | 2/1999 |

(Continued)

OTHER PUBLICATIONS

Bagheri, Rahim, "An 800-MHz-6-GHz Software-Defined Wireless Receiver in 90-nm CMOS," IEEE Journal of Solid-state Circuits, vol. 41, No. 12, Dec. 2006.

(Continued)

*Primary Examiner* — Simon Nguyen
(74) *Attorney, Agent, or Firm* — Eric Ho (57) ABSTRACT

Selectable sizes for a local oscillator (LO) buffer and mixer are disclosed. In an exemplary embodiment, LO buffer and/or mixer size may be increased when a receiver or transmitter operates in a high gain mode, while LO buffer and/or mixer size may be decreased when the receiver or transmitter operates in a low gain mode. In an exemplary embodiment, LO buffer and mixer sizes are increased and decreased in lock step. Circuit topologies and control schemes for specific exemplary embodiments of LO buffers and mixers having adjustable size are disclosed.

27 Claims, 9 Drawing Sheets

(56) References Cited

U.S. PATENT DOCUMENTS

| | | | |
|---|---|---|---|
| 5,469,105 A | 11/1995 | Sparks | |
| 5,841,326 A * | 11/1998 | Kitazono et al. | 331/117 R |
| 5,930,696 A | 7/1999 | Tzuang et al. | |
| 5,966,666 A | 10/1999 | Yamaguchi et al. | |
| 6,016,422 A | 1/2000 | Bartusiak | |
| 6,259,301 B1 | 7/2001 | Gailus et al. | |
| 6,266,517 B1 | 7/2001 | Fitzpatrick et al. | |
| 6,307,894 B2 | 10/2001 | Eidson et al. | |
| 6,356,746 B1 | 3/2002 | Katayama | |
| 6,487,398 B1 | 11/2002 | Nobbe et al. | |
| 6,590,438 B1 * | 7/2003 | Manku et al. | 327/359 |
| 6,906,996 B2 | 6/2005 | Ballantyne | |
| 6,985,033 B1 | 1/2006 | Shirali et al. | |
| 7,023,275 B2 | 4/2006 | Miyamoto | |
| 7,027,833 B1 * | 4/2006 | Goodman | 455/553.1 |
| 7,076,231 B2 | 7/2006 | Yamawaki et al. | |
| 7,092,676 B2 | 8/2006 | Abdelgany et al. | |
| 7,102,411 B2 * | 9/2006 | Behzad | 327/359 |
| 7,120,413 B2 | 10/2006 | Lee et al. | |
| 7,139,547 B2 * | 11/2006 | Wakayama et al. | 455/333 |
| 7,151,919 B2 | 12/2006 | Takalo et al. | |
| 7,236,212 B2 | 6/2007 | Carr et al. | |
| 7,277,689 B2 | 10/2007 | Simon | |
| 7,280,805 B2 | 10/2007 | Xu et al. | |
| 7,392,026 B2 | 6/2008 | Alam et al. | |
| 7,457,605 B2 | 11/2008 | Thompson et al. | |
| 7,460,844 B2 | 12/2008 | Molnar et al. | |
| 7,468,629 B2 | 12/2008 | Chien | |
| 7,573,347 B2 * | 8/2009 | Mayer et al. | 331/179 |
| 7,603,094 B2 | 10/2009 | Rahman et al. | |
| 7,693,496 B2 | 4/2010 | Lewis | |
| 7,702,359 B2 | 4/2010 | Tanaka et al. | |
| 7,729,681 B2 | 6/2010 | Someya | |
| 7,750,749 B2 * | 7/2010 | Jones | 332/105 |
| 7,778,613 B2 * | 8/2010 | Seendripu et al. | 455/130 |
| 7,826,814 B2 * | 11/2010 | Masuda | 455/258 |
| 7,853,212 B2 | 12/2010 | van Waasen | |
| 7,860,470 B2 * | 12/2010 | Xu et al. | 455/147 |
| 7,894,790 B2 * | 2/2011 | Gomez et al. | 455/314 |
| 7,899,426 B2 | 3/2011 | Tasic et al. | |
| 7,941,115 B2 | 5/2011 | Aniruddhan et al. | |
| 7,974,356 B2 | 7/2011 | Rofougaran et al. | |
| 8,019,310 B2 | 9/2011 | Sahota et al. | |
| 2002/0167369 A1 | 11/2002 | Yamaji et al. | |
| 2003/0155959 A1 | 8/2003 | Belot et al. | |
| 2004/0071225 A1 | 4/2004 | Suzuki et al. | |
| 2004/0127172 A1 * | 7/2004 | Gierkink et al. | 455/91 |
| 2004/0137862 A1 | 7/2004 | Tanaka et al. | |
| 2004/0253939 A1 | 12/2004 | Castaneda et al. | |
| 2005/0107055 A1 | 5/2005 | Bult et al. | |
| 2005/0117664 A1 | 6/2005 | Adan et al. | |
| 2005/0191976 A1 | 9/2005 | Shakeshaft et al. | |
| 2005/0220217 A1 | 10/2005 | Yamawaki et al. | |
| 2005/0282512 A1 | 12/2005 | Yu | |
| 2006/0038710 A1 | 2/2006 | Staszewski et al. | |
| 2006/0068746 A1 * | 3/2006 | Feng et al. | 455/323 |
| 2006/0119493 A1 | 6/2006 | Tal et al. | |
| 2006/0246862 A1 | 11/2006 | Agarwal et al. | |
| 2006/0261907 A1 | 11/2006 | Efstathiou et al. | |
| 2007/0015472 A1 | 1/2007 | Murtojarvi et al. | |
| 2007/0072558 A1 | 3/2007 | Sridharan et al. | |
| 2007/0096980 A1 | 5/2007 | Gradincic et al. | |
| 2007/0111697 A1 * | 5/2007 | Bellantoni | 455/324 |
| 2007/0142000 A1 | 6/2007 | Herzinger | |
| 2007/0238431 A1 | 10/2007 | Zhan et al. | |
| 2007/0247212 A1 | 10/2007 | Zhang | |
| 2007/0298750 A1 | 12/2007 | Masuda | |
| 2008/0014896 A1 | 1/2008 | Zhuo et al. | |
| 2008/0125060 A1 | 5/2008 | Lin et al. | |
| 2009/0023413 A1 | 1/2009 | Xu et al. | |
| 2009/0190692 A1 | 7/2009 | Aniruddhan et al. | |
| 2009/0191825 A1 | 7/2009 | Georgantas et al. | |
| 2009/0239592 A1 | 9/2009 | Deng et al. | |
| 2009/0252252 A1 | 10/2009 | Kim et al. | |
| 2010/0029323 A1 | 2/2010 | Tasic et al. | |
| 2010/0190453 A1 | 7/2010 | Rofougaran et al. | |
| 2014/0105336 A1 | 4/2014 | Deng et al. | |

FOREIGN PATENT DOCUMENTS

| | | |
|---|---|---|
| CN | 1726649 A | 1/2006 |
| CN | 1904773 A | 1/2007 |
| CN | 1981429 A | 6/2007 |
| CN | 101009491 A | 8/2007 |
| EP | 0276130 A2 | 7/1988 |
| EP | 1521376 | 4/2005 |
| EP | 1760877 A1 | 3/2007 |
| EP | 1833161 | 9/2007 |
| JP | 6165624 | 4/1986 |
| JP | H024001 A | 1/1990 |
| JP | H04160809 A | 6/1992 |
| JP | H04345305 A | 12/1992 |
| JP | 7202677 A | 8/1995 |
| JP | 9261102 A | 10/1997 |
| JP | 2000022575 A | 1/2000 |
| JP | 2000091848 A | 3/2000 |
| JP | 2000503826 | 3/2000 |
| JP | 2003032048 A | 1/2003 |
| JP | 2003060441 A | 2/2003 |
| JP | 2003188754 A | 7/2003 |
| JP | 2003283361 A | 10/2003 |
| JP | 2004242240 A | 8/2004 |
| JP | 2004289812 A | 10/2004 |
| JP | 2005057665 A | 3/2005 |
| JP | 2005136830 A | 5/2005 |
| JP | 2005159587 A | 6/2005 |
| JP | 2005184608 A | 7/2005 |
| JP | 2005244397 A | 9/2005 |
| JP | 2005294902 A | 10/2005 |
| JP | 2006014293 A | 1/2006 |
| JP | 2006114965 A | 4/2006 |
| JP | 2006222972 A | 8/2006 |
| JP | 2006279703 A | 10/2006 |
| JP | 2006304040 A | 11/2006 |
| JP | 2007074121 A | 3/2007 |
| JP | 2007522769 A | 8/2007 |
| JP | 3979237 B2 | 9/2007 |
| JP | 2008160327 A | 7/2008 |
| KR | 19990081842 | 11/1999 |
| TW | 566011 B | 12/2003 |
| TW | 200711312 | 3/2007 |
| TW | 200743336 | 11/2007 |
| TW | 200812308 A | 3/2008 |
| TW | 200822581 A | 5/2008 |
| WO | 9726710 | 7/1997 |
| WO | 2005078916 A1 | 8/2005 |
| WO | WO2006002945 | 1/2006 |
| WO | WO2006117589 | 11/2006 |
| WO | 2007053365 | 5/2007 |
| WO | WO2008008759 | 1/2008 |

OTHER PUBLICATIONS

Circa R et al: "Resistive MOSFET mixer for mobile direct conversion receivers" Microwave and Optoelectronics Conference, 2003. IMOC 2003. Proceedings of the 2003 SBMO/IEEE MTT-S International Sep. 20-23, 2003, Piscataway, NJ, USA,IEEE, US, vol. 3, Sep. 20, 2003, pp. 59-64, XP010687639 ISBN: 978-0-7803-7824-7 the whole document.

Kim,K et al.: "A resistively degenerated wide-band passive mixer with low niose figure and +60dBm IIP2 in 0.18 1/4 m CMOS" Radio Frequency Integrated Circuits Symposium, 2008. RFIC 2008, IEEE Piscataway, NJ, US, Jun. 17, 2008, pp. 185-188. ISBN: 978-1-4244-1808-4.

Nguyen et al., "A Low-Power RF Direct-Conversion Receiver/Transmitter for 2.4-GHz-Band IEEE 802.15.4 Standard in 0.18-.mu.m CMOS Technology," vol. 54, No. 12, Dec. 2006, pp. 4062-4071.

Razavi B et al: "Multiband UWB transceivers" Custom Integrated Circuits Conference, 2005. Proceedings of the IEEE 2005, IEEE, Piscataway, NJ, USA, Sep. 18, 2005, pp. 140-147, XP010873764 ISBN: 978-0-7803-9023-2 the whole document.

(56) References Cited

OTHER PUBLICATIONS

Translation of Office Action in Japan application 2010-525056 corresponding to U.S. Appl. No. 11/855,997, citing WO2007053365A1 and JP2005184608 dated Feb. 22, 2011.
Translation of Office Action in Korean application 10-2010-7008070 corresponding to U.S. Appl. No. 12/209,164, citing WO2007053365 and KR19990081842 dated Apr. 29, 2011.
Translation of Office Action in Korean application 2010-7008071 corresponding to U.S. Appl. No. 12/209,164, citing KR19990081842 and KIM_BONKEE_ET_AL_A_2_6_V_GSM_PCN_year_2002 dated Apr. 29, 2011.
Translation of Office Action in Korean application 2010-7011862 corresponding to U.S. Appl. No. 11/955,201, citing KR19990081842 and KIM_BONKEE_ET_AL_2_6_V_GSM_PCN_year_2002 dated Apr. 29, 2011.
Wan, Jiansong, "Tunable Bandpass (1 .7-6)GHz Polyphase Filter in Near Zero IF Receiver," Philips, Jul. 2007.
Zhu, Yide, "Harmonic Rejection Mixer for Digital Video Broadcase-Handheld," Thesis, Delft University of Technology, Jun. 2007.
Brenna G et al.: "A 2GHz Carrier Leakage Calibrated Direct-Conversion WCDMA Transmitter in 0.13<tex> $muhboxm$./tex. CMOS" IEEE Hournal of Solid-State Circuits, IEEE vol. 39, No. 8, Aug. 1, 2004, pp. 1253-1262, XP01115212.
International Search Report—PCT/US08/076321, International Search Authority—European Patent Office—Jan. 7, 2009.
Written Opinion—PCT/US08/076321, International Search Authority—European Patent Office—Jan. 7, 2009.
International Search Report—PCT/US08/076324, International Search Authority—European Patent Office—Jan. 7, 2009.
Written Opinion—PCT/US08/076324, International Search Authority—European Patent Office—Jan. 7, 2009.
Farbod Behbahani et al: "A 2.4-GHz Low-IF Receiver for Wideband WLAN in 0.6-m CMOS-Architecture and Front-End" IEEE Journal of Solid-State Circuits, IEEE Service Center, Piscataway, NJ, US, vol. 35, No. 12, pp. 1908-19161 (Dec. 1, 2000), XP011061384 ISSN: 0018-9200 section IV B figure 8a.
Kim, Bonkee et al: "A 2.6 V GSM/PCN Dual Band Variable Gain Low Noise RF Down Conversion Mixer" 2002 IEEE Radio Frequency Integrated Circuits Symposium, 2002, pp. 137-140, XP002508867 sections II and III figures 1-3.
Mayer C et al: "A Robust GSM/EDGE Transmitter Using Polar Modulation Techniques" Wireless Technology, 2005. The European Conference on CNIT LA Defense, Paris Oct. 3-4, 2005, Piscataway, NJ, USA,IEEE LNKDDOI: 10.1109/ECWT.2005.1617663, Oct. 3, 2005, pp. 103-106, XP010908871 ISBN: 978-2-9600551-1-5 figure 2.
McCune E Ed—Maxim A: "Polar modulation and bipolar RF power devices" Bipolar/BICMOS Circuits and Technology Meeting, 2005. Proceedings of the, IEEE, Piscataway, NJ, USA LNKDDOI: 10.1109/BIPOL.2005.1555188, Oct. 9, 2005, pp. 1-5, XP010861821 ISBN: 978-0-7803-9309-7 figure 2.
Ziv R et al: "A phase correction technique applied to 700MHz a 6GHz complex demodulators in multi-band wireless systems" Microwaves, Communications, Antennas and Electronic Systems, 2008. C0MCAS 2008. IEEE International Conference on, IEEE, Piscataway, NJ, USA, May 13, 2008, pp. 1-8, XP031285366 ISBN: 978-1-4244-2097-1 the whole document.
Taiwan Search Report—TW097135405—TIPO—Nov. 4, 2011.
Jau, J.K., et al., "Highly efficient multimode RF transmitter using the hybrid quadrature polar modulation scheme," Microwave Symposium Digest, 2006, IEEE MTT-S International, Nov. 20, 2006.
Wang, W., et al., "A C-band pHEMT Gilbert Mixer MMIC", Research and Progress of SSE, vol. 27, No. 2, May 2007, pp. 194-198.

* cited by examiner

FIG 9

LOCAL OSCILLATOR BUFFER AND MIXER HAVING ADJUSTABLE SIZE

RELATED APPLICATIONS

The present application is a continuation-in-part of U.S. patent application Ser. No. 11/855,997, entitled "Mixer with high output power accuracy and low local oscillator leakage," filed on Sep. 14, 2007, assigned to the assignee of the present application, the contents of which are hereby incorporated by reference in their entirety. The present application is also a continuation-in-part of U.S. patent application Ser. No. 11/955,201, entitled "Local oscillator buffer and mixer having adjustable size," filed on Dec. 12, 2007, which claims priority to U.S. Provisional Patent Application Ser. No. 60/983,879, filed on Oct. 30, 2007, both assigned to the assignee of the present application, the contents of which are hereby incorporated by reference in their entirety.

TECHNICAL FIELD

The disclosure relates to communications devices and, more particularly, to techniques for adjusting the size of local oscillator buffers and mixers in communications devices.

BACKGROUND

In a communications system, a transmitter may upconvert a baseband signal into a radio-frequency (RF) signal by mixing the baseband signal with a local oscillator (LO) signal using a mixer. A receiver may receive the RF signal from the transmitter and downconvert the received signal from RF to baseband, also by mixing the RF signal with an LO signal using a mixer. In both the transmitter and receiver, an LO buffer may be provided to buffer an LO signal before providing it to the mixer.

The optimal sizes for the mixer and the LO buffer depend on the requirements of the transmitter or receiver. For example, in a transmitter, the sizes of the mixer and LO buffer may depend on the total transmit power required from the transmitter. See, e.g., U.S. patent application Ser. No. 11/855, 997, earlier referenced herein. In a receiver, larger mixer size tends to improve receiver linearity, while a smaller mixer size reduces power consumption. Employing a larger mixer size usually mandates a correspondingly larger LO buffer, as the size of the mixer directly determines the load on the LO buffer.

In conventional transmitters and receivers, the sizes of the LO buffer and mixer are fixed. It would be desirable to dynamically adjust the size of the LO buffer and/or mixers depending on the requirements of the transmitter or receiver.

SUMMARY

An aspect of the present disclosure provides a communications apparatus comprising: a local oscillator (LO) buffer operative to buffer an LO signal to produce a buffered LO signal, the LO buffer having a selectable size.

Another aspect of the present disclosure provides a method for selecting a size of at least one component in a transmitter, the transmitter comprising a mixer and a local oscillator (LO) buffer, the method comprising: selecting a first mixer size when the transmitter is in a first gain mode; and selecting a second mixer size when the transmitter is in a second gain mode.

Yet another aspect of the present disclosure provides an apparatus comprising: means for providing a mixer having a selectable size; means for providing a local oscillator (LO) buffer having a selectable size.

Yet another aspect of the present disclosure provides an apparatus for selecting a size of at least one component in a transmitter, the transmitter comprising a mixer and a local oscillator (LO) buffer, the apparatus comprising: means for selecting a first mixer size when the transmitter is in a first gain mode, and selecting a second mixer size when the transmitter is in a second gain mode.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

In accordance with the present disclosure, techniques are disclosed for dynamically adjusting the sizes of the LO buffer and/or mixer depending on the requirements of a receiver or transmitter.

Figure 1:
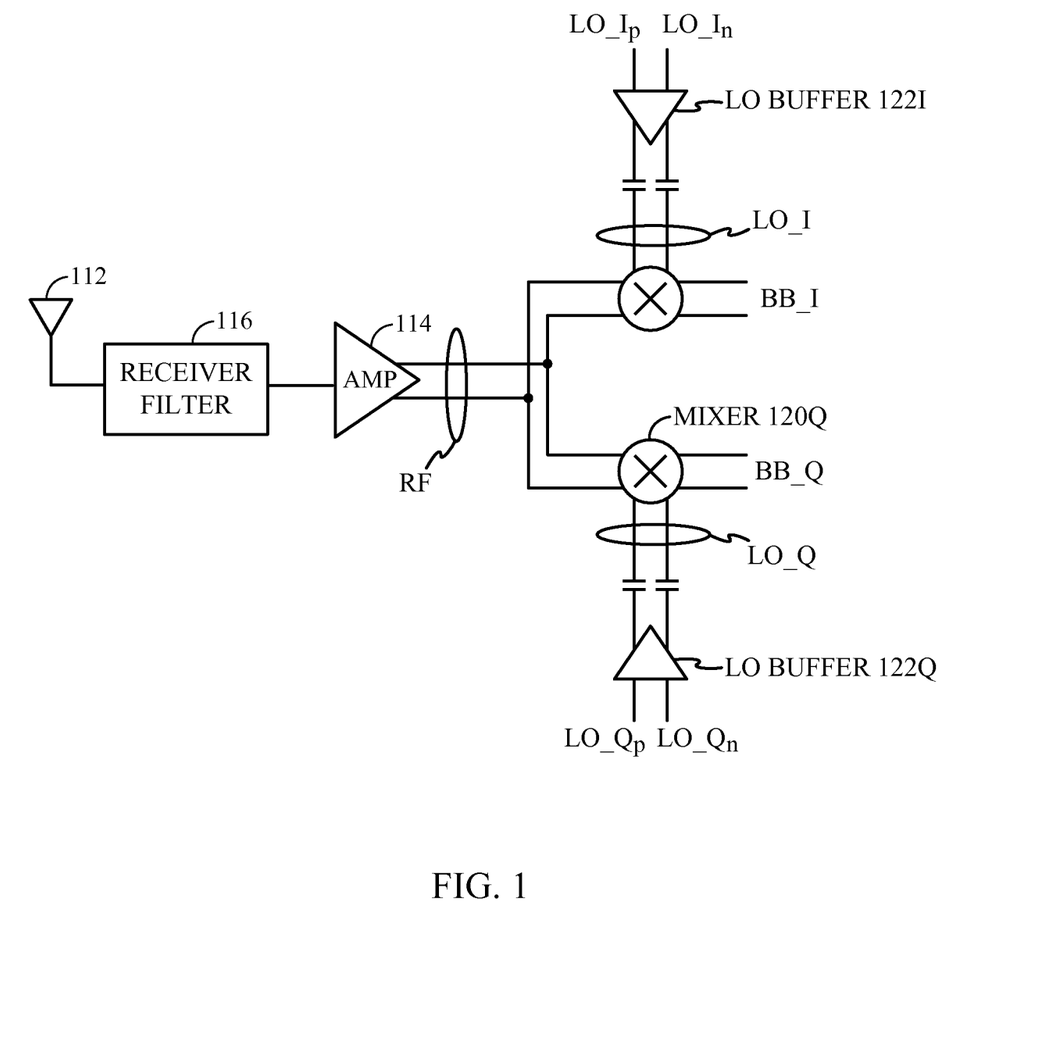
FIG. 1 depicts a portion of a receiver unit 100 known in the prior art.

FIG. 1 depicts a portion of a receiver unit 100 known in the prior art. Receiver unit 100 may be implemented within a terminal or a base station of a wireless (e.g., CDMA) communication system. Note other RF receiver designs may also be used and are within the scope of the present disclosure.

In FIG. 1, one or more RF modulated signals transmitted from one or more transmitters (e.g., base stations, GPS satellites, broadcast stations, and so on) are received by an antenna 112 and provided to a receiver filter 116. The filtered signal is then provided to an amplifier (Amp) 114. Amplifier 114 amplifies the received signal with a particular gain to provide an amplified RF signal. Amplifier 114 may include one or more low noise amplifier (LNA) stages designed to provide a particular range of gains and/or attenuation. The amplified RF signal is provided to mixers 120I and 120Q. Note the output of the amplifier 114 may be a differential signal, as shown in FIG. 1.

Mixers 120I and 120Q perform quadrature downconversion of the filtered RF signal from RF to baseband (BB). This may be achieved by multiplying (or mixing) the filtered RF signal with a complex local oscillator (LO) signal to provide a complex baseband signal. In particular, the filtered RF signal may be mixed with an inphase LO signal LO_I by mixer 120I to provide an inphase (I) baseband component BB_I. The filtered RF signal may also be mixed with a quadrature-phase LO signal LO_Q by mixer 120Q to provide a quadrature (Q) baseband component BB_Q. BB_I and BB_Q may be subsequently processed by additional blocks (not shown), e.g., a channel filter, a variable gain amplifier (VGA), and/or an analog-to-digital converter (ADC).

Note while this specification may refer to exemplary embodiments wherein the RF signal is directly mixed to baseband, exemplary embodiments wherein the RF signal is mixed to a non-zero intermediate frequency (IF) are also within the scope of the disclosure.

In FIG. 1, LO_I is provided to mixer 120I via an LO buffer 122I, whose input is a differential signal LO_Ip–LO_In. Similarly, LO_Q is provided to mixer 120Q via an LO buffer 122Q, whose input is a differential signal LO_Qp–LO_Qn. In a conventional receiver, the size of the mixers 120I and 120Q, and the size of the LO buffers 122I and 122Q, are fixed. Note in this specification and in the claims, the "size" of a buffer or a mixer may be understood to encompass the width of any or all transistors in the signal path of such a buffer or mixer.

According to the present disclosure, techniques are provided for adjusting the size of the mixer and/or LO buffer, and for dynamically configuring the sizes based on the requirements of the apparatus.

Figure 2:
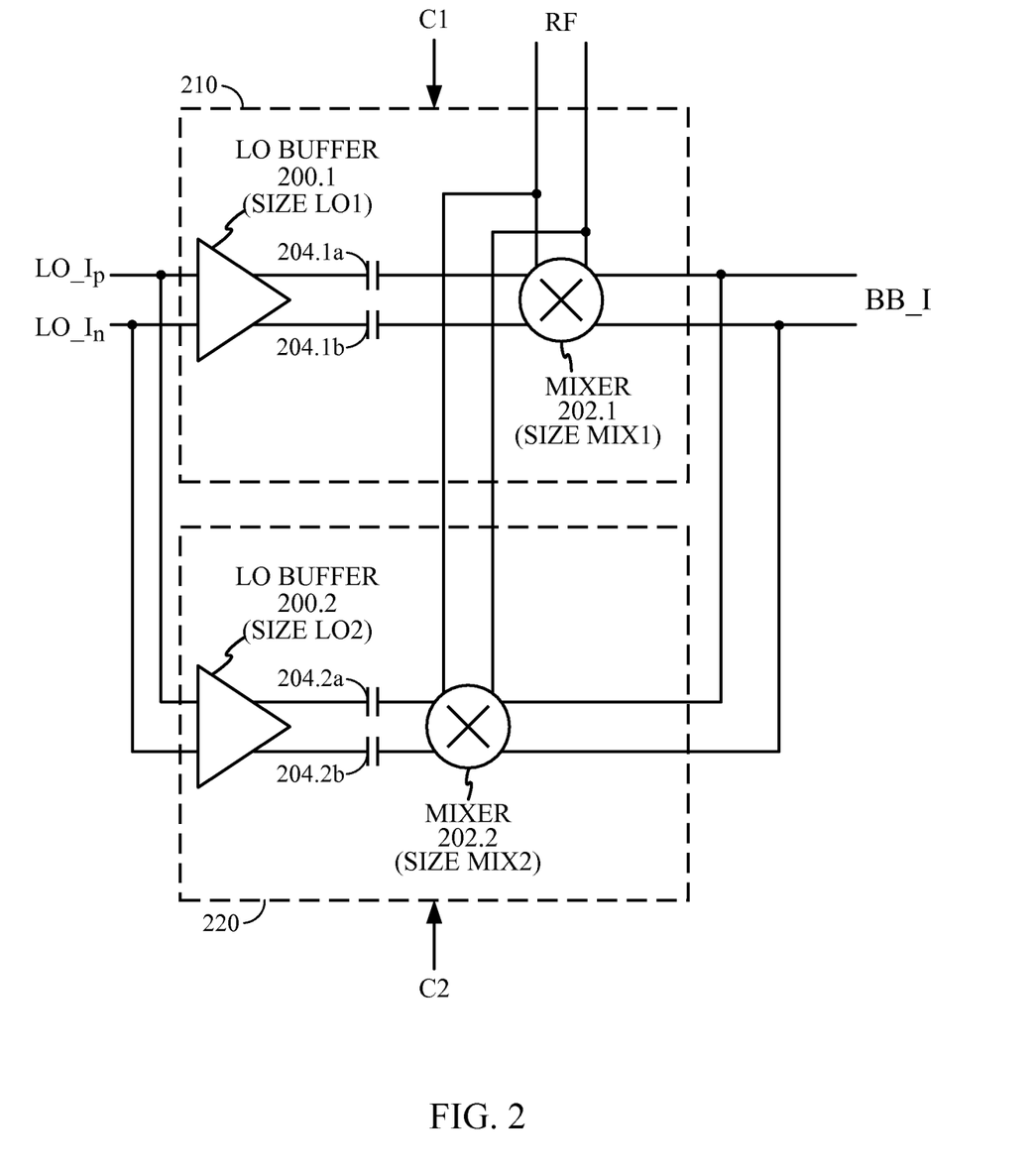
FIG. 2 shows an exemplary embodiment of an in-phase LO buffer and mixer according to the present disclosure.

FIG. 2 shows an exemplary embodiment of an in-phase LO buffer and mixer according to the present disclosure. One of ordinary skill in the art will realize that the techniques described may be directly applied to a quadrature-phase buffer and mixer. In the exemplary embodiment shown, the mixer has a current output. One of ordinary skill in the art may readily modify FIG. 2 to accommodate mixers having voltage outputs.

In FIG. 2, a differential LO signal LO_Ip–LO_In is provided to an LO buffer 200.1 of size LO1. The output of buffer 200.1 is coupled to the input of a mixer 202.1 of size MIX1 via coupling capacitors 204.1a and 204.1b. The signal path associated with buffer 200.1, mixer 202.1, and capacitors 204.1a and 204.1b (collectively labeled 210) may be referred to as the first signal path.

Similarly, the differential LO signal LO_Ip–LO_In is also provided to an LO buffer 200.2 of size LO2, whose output is coupled to the input of a mixer 202.2 of size MIX2 via coupling capacitors 204.2a and 204.2b. The signal path associated with buffer 200.2, mixer 202.2, and capacitors 204.2a and 204.2b (collectively labeled 220) may be referred to as the second signal path.

In FIG. 2, control signals C1 and C2 selectively enable or disable the first and second signal path, respectively. In an exemplary embodiment, this may be done by turning on or off the LO buffer and/or the mixer in the signal path, or by opening or closing a switch (not shown) placed in series with each signal path. One of ordinary skill in the art will recognize that a signal path may be selectively enabled or disabled using a variety of techniques not explicitly described herein. Such exemplary embodiments are contemplated to be within the scope of the present disclosure.

In an exemplary embodiment, the effective size of the LO buffer and mixer can be configured by selectively enabling the first, second, or both signal paths.

In particular, if the first signal path is enabled, and the second signal path is disabled, then the effective LO buffer size is LO1, and the effective mixer size is MIX1. Conversely, if the first signal path is disabled, and the second signal path is enabled, then the LO buffer size is LO2, and the mixer size is MIX2. Both signal paths may also be simultaneously enabled.

In a specific exemplary embodiment, LO2 is twice the value of LO1, and MIX2 is twice the value of MIX1. In this case, by setting control signals C1 and C2, the effective LO buffer/mixer size can be selected from a first size (first path enabled), a second size twice the first size (second path enabled), and a third size three times the first size (both paths enabled).

Note that in general, the sizes LO2, LO1, MIX2, and MIX1 may be arbitrarily chosen to have any relationship with each other. Any combination of sizes is contemplated to be within the scope of the present disclosure.

One of ordinary skill in the art will realize that the exemplary embodiment shown in FIG. 2 may be readily modified to accommodate more than two signal paths, e.g., three or more signal paths, providing even greater choice in the range of configurable buffer and mixer sizes. Such alternative exemplary embodiments are also contemplated to be within the scope of the present disclosure.

Figure 3:
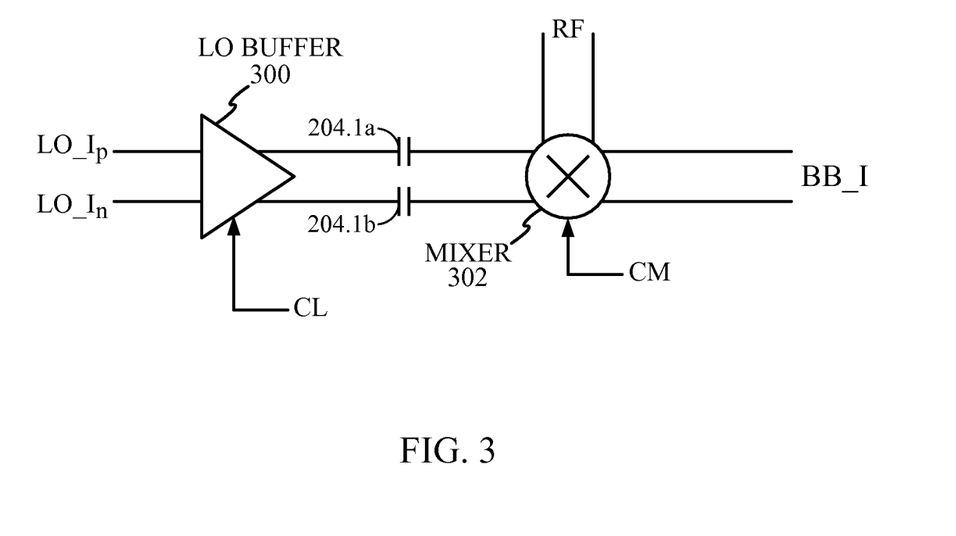
FIG. 3 depicts an alternative exemplary embodiment of the present disclosure, wherein the sizes of the LO buffer and mixer are made separately configurable.

FIG. 3 depicts an alternative exemplary embodiment of the present disclosure, wherein the sizes of the LO buffer and mixer are made separately configurable. In FIG. 3, a control signal CL selects a size of the LO buffer 300. Similarly, a control signal CM selects a size of the mixer 302. Note CL and CM may each comprise a plurality of sub-signals, depending on the number of sizes that are selectable within each block.

Figure 4:
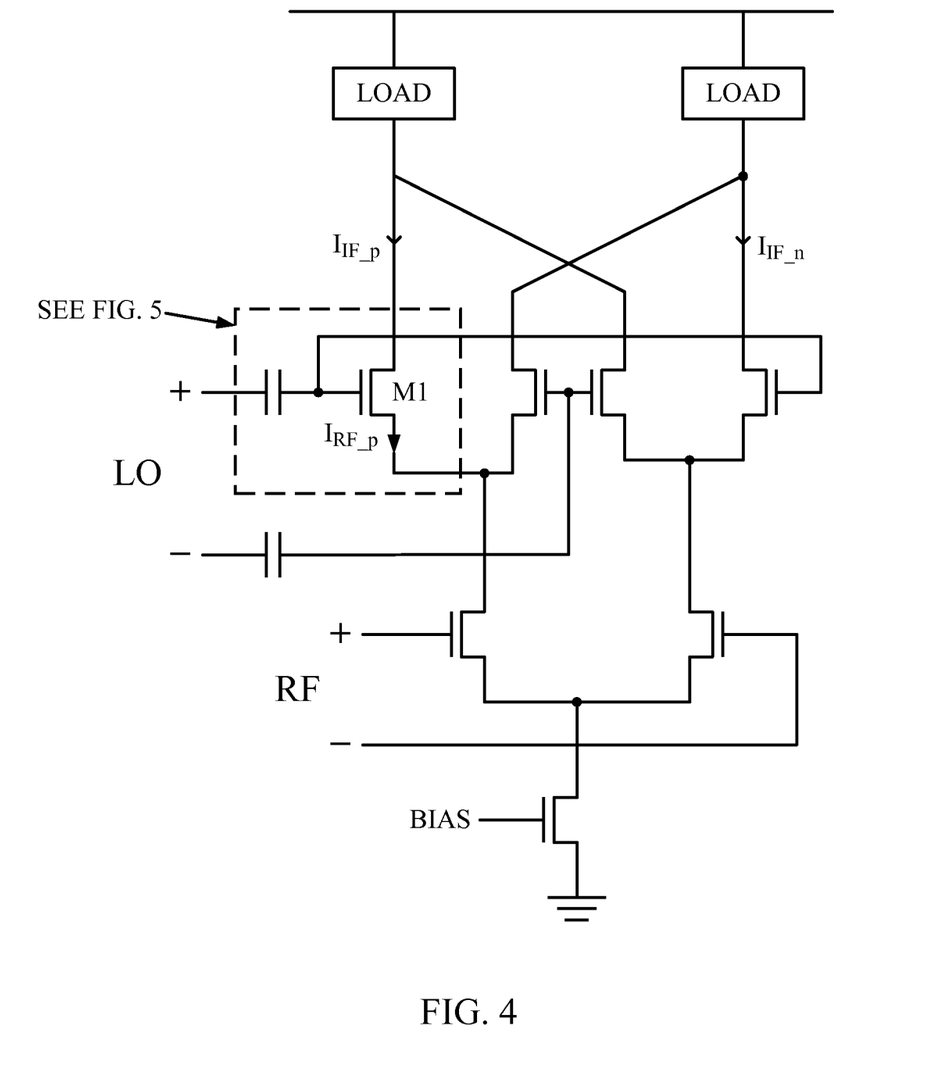
FIG. 4 depicts a conventional Gilbert multiplier architecture.
Figure 5:
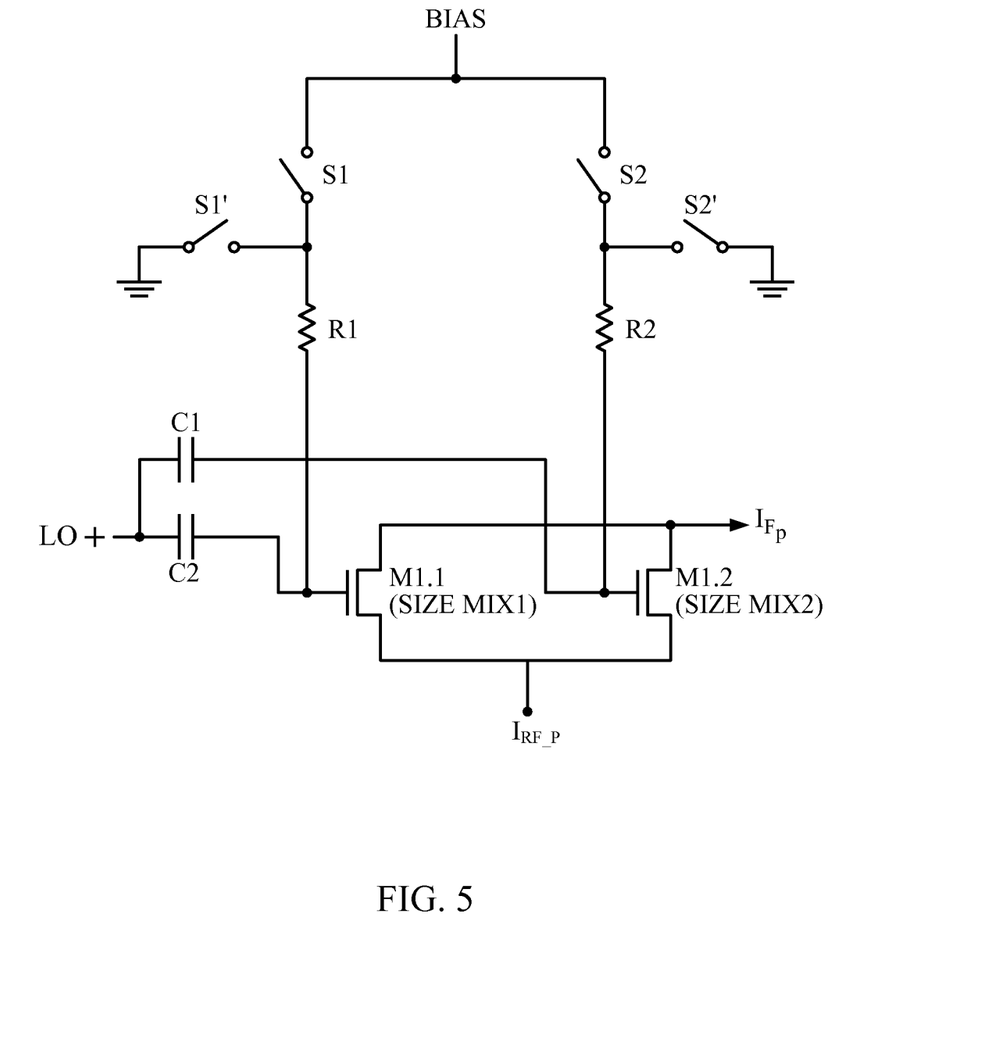
FIG. 5 depicts a detailed view of a circuit topology by which the size of one of the transistors, M1, coupled to the signal LO(+) in FIG. 4, is made adjustable according to the present disclosure.

In an exemplary embodiment, a mixer having adjustable sizes may be implemented by modifying a Gilbert multiplier architecture using the techniques described herein with reference to FIGS. 4 and 5.

FIG. 4 depicts a Gilbert multiplier architecture. In FIG. 4, a RF signal (RF) is multiplied to a local oscillator signal (LO) to generate a differential output current $I_{IF\_p} - I_{IF\_n}$. The operation of Gilbert multipliers is well known in the art, and will not be described further herein. Note FIG. 4 does not show the gate biasing arrangement for the transistors of the Gilbert multiplier.

According to the present disclosure, the size of the transistors coupled to the LO in FIG. 4 may be made adjustable according to the exemplary embodiment of FIG. 5.

FIG. 5 depicts a detailed view of a circuit topology by which the size of one of the transistors, M1, coupled to the signal LO(+) in FIG. 4, is made adjustable according to the present disclosure. One of ordinary skill in the art may readily apply the techniques depicted in FIG. 5 to make the size of the other transistors in FIG. 4 adjustable. Such exemplary embodiments are contemplated to be within the scope of the present disclosure.

In FIG. 5, transistor M1 is replaced by two transistors M1.1 and M1.2 having sizes MIX1 and MIX2, respectively. Transistors M1.1 and M1.2 are each coupled by a coupling capacitor C1 or C2 to the positive output of the LO buffer, LO(+). M1.1 and M1.2 are also coupled via bias resistance R1 or R2 to either ground or a bias voltage Vbias via switches S1/S1' and S2/S2'. According to the present disclosure, switch S1 is closed when S1' is open, and vice versa, and similarly for switches S2/S2'. The state of the switches may be controlled by the control signal CM provided to the mixer, as shown in FIG. 3.

The operation of the circuit shown in FIG. 5 may be characterized as follows. When S1 is closed and S2 is open, M1.1 is turned on, and M1.2 is turned off. This is because the gate of M1.1 is coupled to Vbias, while the gate of M1.2 is coupled to ground. In this case, the effective size of the transistor M1 as presented to the positive output of the LO buffer LO(+) is MIX1. Similarly, when S2 is closed and S1 is open, M1.2 is turned on, and M1.1 is turned off. In this case, the effective size of the transistor M1 is MIX2. Finally, when S1 and S2 are both closed, then both M1.1 and M1.2 are turned on. In this case, the effective size of the transistor M1 is MIX1+MIX2.

In an exemplary embodiment, the size MIX2 can be twice as large as MIX1. In this case, the size of transistor M1 is selectable effectively among MIX1, 2*MIX1, and 3*MIX1, by configuring the switches S1 and S2 as described above. Note in general, the values of MIX2 and MIX1 can have any relationship with each other.

One of ordinary skill in the art may readily modify the design depicted in FIG. 5 to accommodate more than the two transistors shown, to allow for further configurability using more selectable sizes. Note the control signal provided to the switches, e.g., CM according to FIG. 3, may be readily modified to accommodate more than two switches. Such exemplary embodiments are contemplated to be within the scope of the disclosure.

Figure 6:
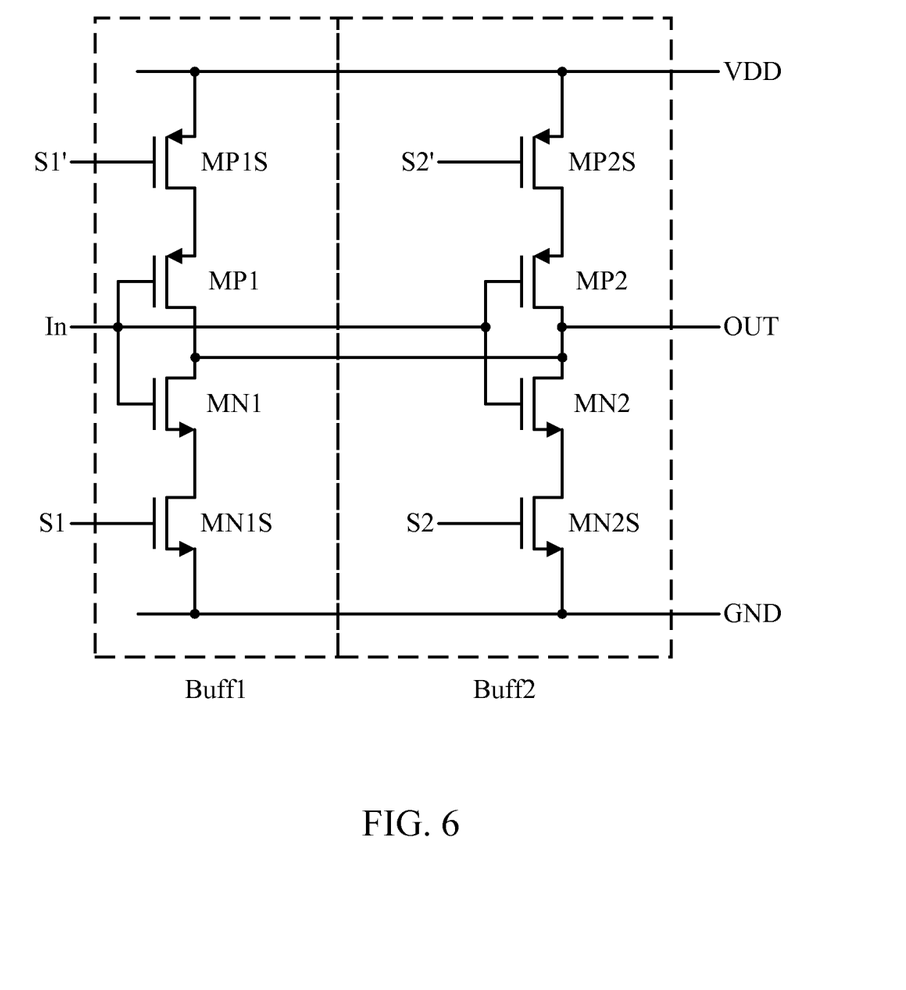
FIG. 6 depicts an exemplary embodiment of an LO buffer with adjustable sizes according to the present disclosure.

FIG. 6 depicts an exemplary embodiment of an LO buffer with adjustable sizes according to the present disclosure.

In FIG. 6, a first amplifier Buff1 includes active transistors MP1 and MN1 driven by an input signal In. Coupled in series with MN1 and MP1 are switches MN1S and MP1S controlled by S1 and S1', respectively. In an exemplary embodiment, S1' is the inverse of S1, i.e., S1' is high when S1 is low, and vice versa. The drains of MN1 and MP1 are coupled to the output signal Out.

A second amplifier Buff2 similarly includes active transistors MP2 and MN2 driven by the input signal In. Coupled in series with MN2 and MP2 are switches MN2S and MP2S controlled by signals S2 and S2', respectively. In an exemplary embodiment, S2' is the inverse of S2, i.e., S2' is high when S2 is low, and vice versa. The drains of MN2 and MP2 are also coupled to the output signal Out.

The operation of the circuit in FIG. 6 may be characterized as follows. When S1 is high and S2 is low, then Buff1 is turned on, and Buff2 is turned off. This is because the switches S1 and S1' are turned on, while S2 and S2' are turned off. In this case, the effective size of the LO buffer corresponds to the gate sizes of transistors MP1 and MN1. Similarly, when S2 is high and S1 is low, then Buff2 is turned on, and Buff1 is turned off. In this case, the effective size of the LO buffer corresponds to the gate sizes of transistors MP2 and MN2. Finally, when S1 and S2 are both high, then both Buff1 and Buff2 are turned on. In this case, the effective size of the LO buffer corresponds to the combined gate sizes of MP2 and MP1, and the combined gate sizes of MN2 and MN1.

By configuring the signals S1 and S2, the effective size of the LO buffer is selectable among that of MP1/MN1 (Buff1 turned on), MP2/MN2 (Buff2 turned on), or MP1/MN1/MP2/MN2 (Buff1 and Buff2 turned on). In general, the sizes of the transistors can have any relationship with each other. In an exemplary embodiment, MP2 and MN2 are twice as large as MP1 and MN1, respectively.

One of ordinary skill in the art may readily modify the design depicted in FIG. 6 to accommodate more than the two buffers shown, to allow for further configurability using more selectable sizes. Note the control signal provided to the switches, e.g., CL according to FIG. 3, may also be readily modified to accommodate more than two switches. Such exemplary embodiments are contemplated to be within the scope of the disclosure.

Figure 7:
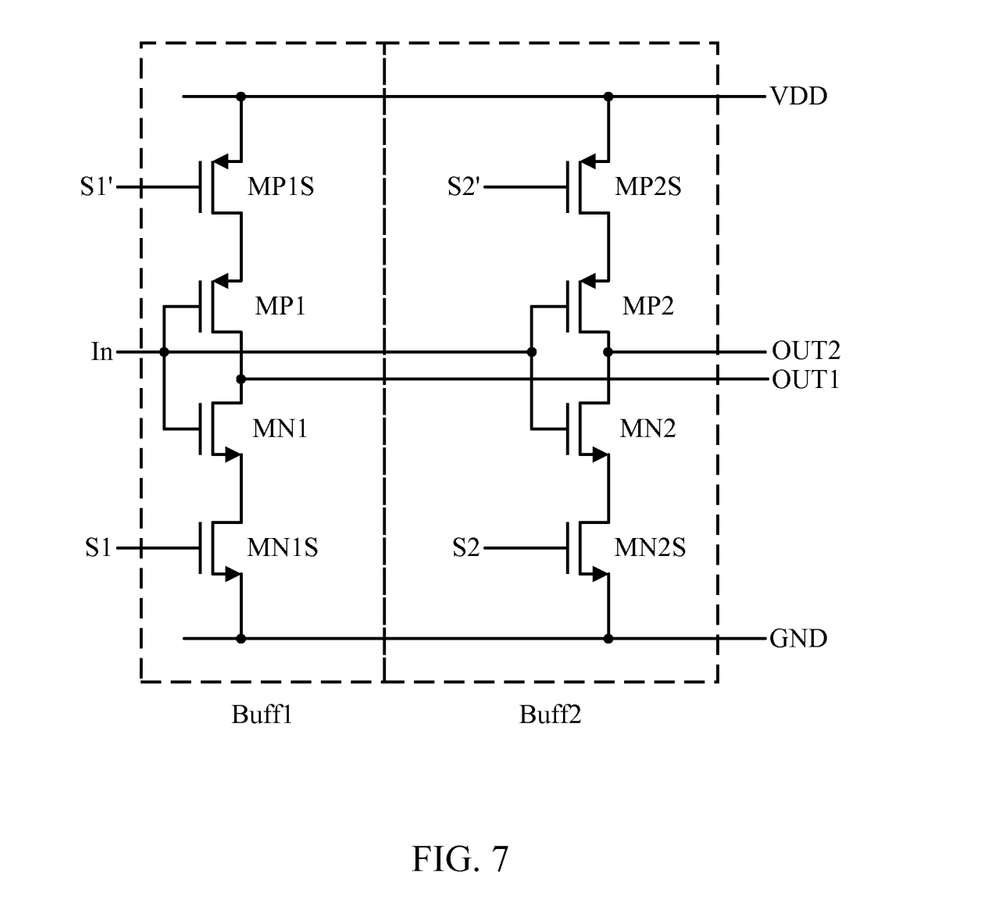
FIG. 7 depicts an exemplary embodiment of an LO buffer with an adjustable size, configured to drive separate mixers.

FIG. 7 depicts an exemplary embodiment of an LO buffer with an adjustable size, configured to drive separate mixers. The operation of the exemplary embodiment in FIG. 7 is identical to that of the exemplary embodiment in FIG. 6, except that the output OUT1 of the first buffer Buff1 is kept separate from the output OUT2 of the second buffer Buff2. In this way, Buff1 in Buff2 in FIG. 7 may be employed as LO Buffer 200.1 and LO Buffer 200.2 in FIG. 2, i.e., to drive two separate mixers 202.1 and 202.2.

According to the present disclosure, techniques have been provided for selectable LO buffer and/or mixer sizes in a receiver circuit. Another aspect of the present disclosure provides for selection of LO buffer and/or mixer sizes based on an operating mode of the receiver.

In a typical implementation of the receiver in FIG. 1, the overall gain of the receiver chain may take on a plurality of values depending on the received signal strength. For example, when the received signal strength is high, the receiver chain may be configured to have a low overall gain. Conversely, when the received signal strength is low, the receiver chain may be configured to have a high gain. The gain may be configured by, e.g., programming the gain of the LNA and/or mixer to the desired levels.

According to the present disclosure, the LO buffer and/or mixer sizes may be selected depending on the gain mode of the receiver to minimize the current consumption in such gain mode.

In an exemplary embodiment, the LO buffer size may be made a function of the receiver gain mode. The LO buffer size may be increased in response to the receiver being switched from a lower gain to a higher gain mode. Alternatively, the LO buffer size may be decreased in response to the receiver being switched from a lower gain to a higher gain mode.

In an exemplary embodiment, the mixer size may also be made a function of the receiver gain mode. The mixer size may be increased in response to the receiver being switched from a lower gain mode to a higher gain mode. Alternatively, the mixer size may be decreased in response to the receiver being switched from a lower gain mode to a higher gain mode.

In an exemplary embodiment, when the receiver chain is configured to have a low gain, both the LO buffer and the mixer are configured to a first size. When the receiver chain is configured to have a high gain, both the LO buffer and mixer are configured to a second size larger than the first size. In this exemplary embodiment, the better linearity and phase noise characteristics afforded by a larger LO buffer and mixer are made available when receiving weak signals, while the lower current consumption afforded by a smaller LO buffer and mixer is made available when receiving strong signals.

In an exemplary embodiment, the circuitry described with reference to FIG. 2 may be employed to make the LO buffer and mixer sizes dependent on receiver gain mode. This can be accomplished by configuring control signals C1 and C2 in FIG. 2 based on the gain mode. In another exemplary embodiment, the circuitry described with reference to FIGS. 5 and 6 may be employed by configuring the switches and control signals described with reference thereto based on the receiver gain mode. In yet another exemplary embodiment, any circuit topology allowing for selectable size of a buffer and/or mixer may be employed in the configuration of FIG. 3, with control signals CL and/or CM configured to depend on the receiver gain mode.

In an exemplary embodiment, in response to the receiver gain mode being adjusted, the sizes of the LO buffer and the mixer can be adjusted in lock-step, i.e., when the size of the LO buffer is decreased, so is the size of the mixer, and vice versa. In an exemplary embodiment, any adjustment made to the mixer size is proportional to any adjustment made to the LO buffer size. For example, if the LO buffer size is doubled, so is the mixer size. This ensures that the LO buffer drive capability is matched to the size of the mixer load being driven.

One of ordinary skill in the art will realize that the any number of receiver gain modes greater than two may be associated with a corresponding number of selectable LO buffer and/or mixer sizes. Such exemplary embodiments incorporating more than two modes are contemplated to be within the scope of the present disclosure.

Figure 8:
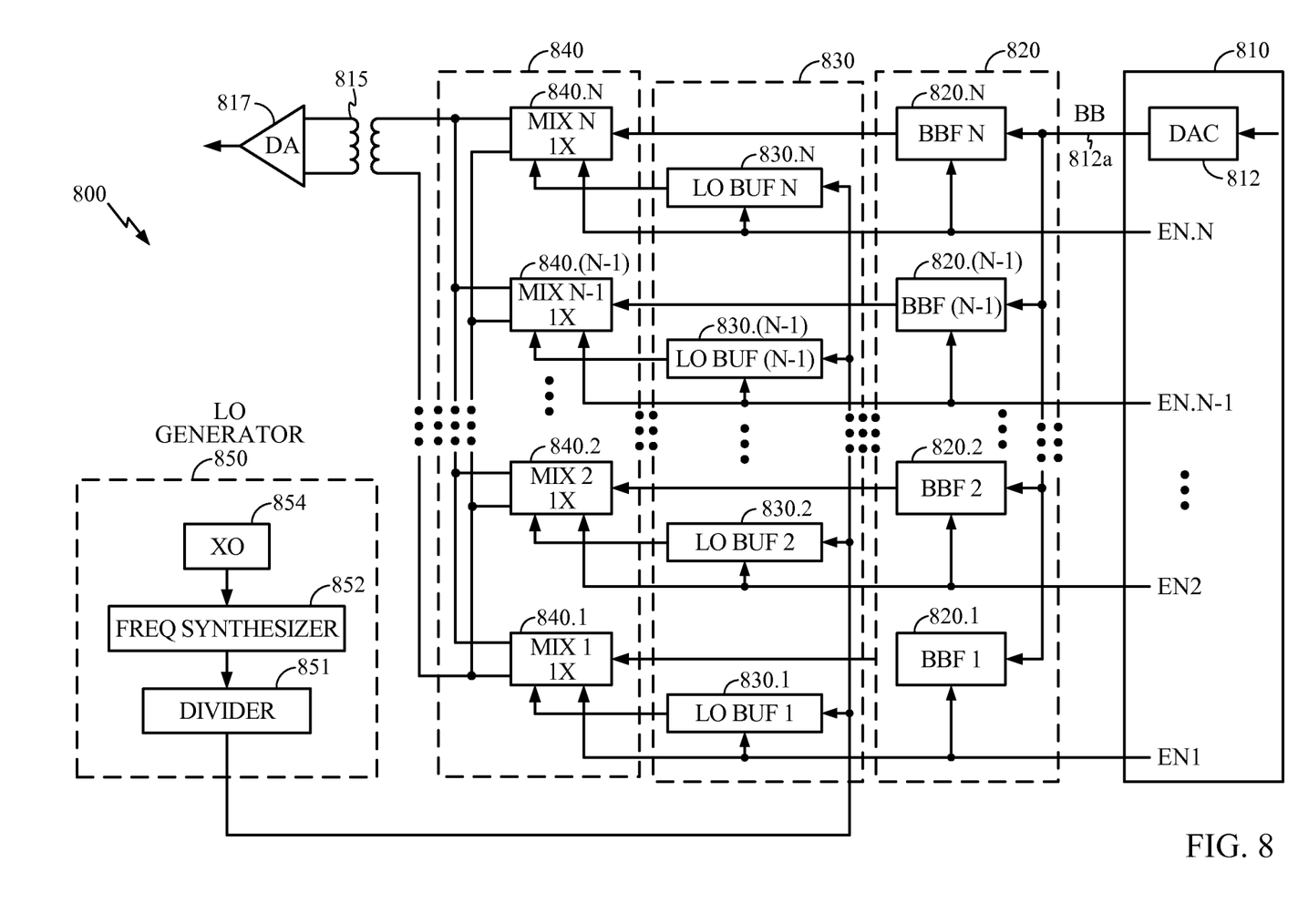
FIG. 8 depicts an exemplary embodiment of a transmitter utilizing a mixer and LO buffer having selectable size according to the present disclosure.

FIG. 8 depicts an exemplary embodiment of a transmitter 800 utilizing a mixer and LO buffer having selectable size according to the present disclosure. In FIG. 8, mixer 840 is composed of sub-mixers 840.1 through 840.N, and LO buffer 830 is composed of sub-LO buffers 830.1 through 830.N associated with each of the sub-mixers. Note each of the sub-mixers 840.1 through 840.N shown may include a plurality of separate mixer circuits including, e.g., an I mixer, an inverse I mixer (for differential processing), a Q mixer, and an inverse Q mixer. Similarly, each of the sub-LO buffers 830.1 through 830.N shown may include a plurality of separate LO buffer circuits for each of the plurality of separate mixer circuits.

In FIG. 8, the sub-mixers 840.1 through 840.N and sub-LO buffers 830.1 through 830.N may be selectively enabled or disabled by a baseband processor 810 using control signals EN.1 through EN.N, respectively. Each sub-mixer mixes a corresponding buffered LO signal with a baseband signal generated by the baseband processor 810, filtered by selectable baseband filters 820.1 through 820.N. The mixed output signals of the sub-mixers are coupled via coupling element 815 to a driver amplifier 817 for further transmission, e.g., over an antenna via a power amplifier (not shown).

In the transmitter 800, the baseband processor 810 may select which of the sub-mixers, sub-LO buffers, and baseband filters to enable, based on criteria including, e.g., total gain of the transmit power required to be delivered to the driver amplifier. For example, to operate in a lowest gain mode, only sub-mixer 840.1, sub-LO buffer 830.1, and baseband filter 820.1 may be enabled, with the remaining sub-mixers, sub-LO buffers, and baseband filters disabled. This mode may correspond to operating the transmitter 800 with a mixer and LO buffer of minimum size. To operate in a highest gain mode, all of sub-mixers 840.1 through 840.N, sub-LO buffers 830.1 through 830.N, and baseband filters 820.1 through 820.N may be enabled. This mode may correspond to operating the transmitter 800 with a mixer and LO buffer of maximum size. One of ordinary skill in the art will appreciate that a mixer and LO buffer of an intermediate size may be obtained by enabling a corresponding subset of the sub-mixers and sub-LO buffers.

In an exemplary embodiment, each instance of the sub-mixer, sub-LO buffer, and baseband filter may be designed to have identical characteristics to every other instance of the sub-mixer, sub-LO buffer, and baseband filter, respectively, so that the gain steps of the transmit power may be precisely controlled. This may be achieved by, e.g., designing the circuit blocks to have identical physical layout to each other on a semiconductor chip, and/or placing the circuit blocks in close physical proximity to each other, and/or locating the circuit blocks symmetrically relative to the LO signal. In FIG. 8, the sub-mixers 840.1 through 840.N are all shown as having identical size to each other, i.e., with a "1×" size multiplier. One of ordinary skill in the art will appreciate that the sub-mixers need not have the same size relative to each other, and may generally have varying sizes, e.g., binary-weighted sizes to facilitate efficient selection of transmit power step size by the baseband processor 810.

In FIG. 8, the local oscillator signal is generated by an LO generator 850, which includes a frequency divider 851 coupled to the output of a frequency synthesizer 852, which is in turn coupled to a crystal oscillator 854. In an exemplary embodiment, the circuit blocks of the LO generator 850 may be kept physically separate from each instance of the sub-mixer/sub-LO buffer/baseband filter, with the output signal of a single instance of a frequency divider 851 coupled to multiple instances 830.1 through 830.N of the LO buffer. Since there is only one frequency divider 850, synchronization of multiple instances of a frequency divider may not be required in the transmitter 800.

Note the techniques described herein for the scalable transmitter architecture 800 are not meant to limit the scope of the present disclosure to any particular implementations of transmitters shown. In alternative exemplary embodiments (not shown), the techniques of the present disclosure may be adopted in transmitters employing additional circuit elements not shown, such as additional gain control elements or filters. The techniques may also be adopted in transmitters employing fewer circuit elements than shown, e.g., wherein the baseband filters 820.1 through 820.N are directly integrated into the baseband processor 810, or wherein only a single baseband filter is provided for all sub-mixers. Such exemplary embodiments are contemplated to be within the scope of the present disclosure.

Figure 9:
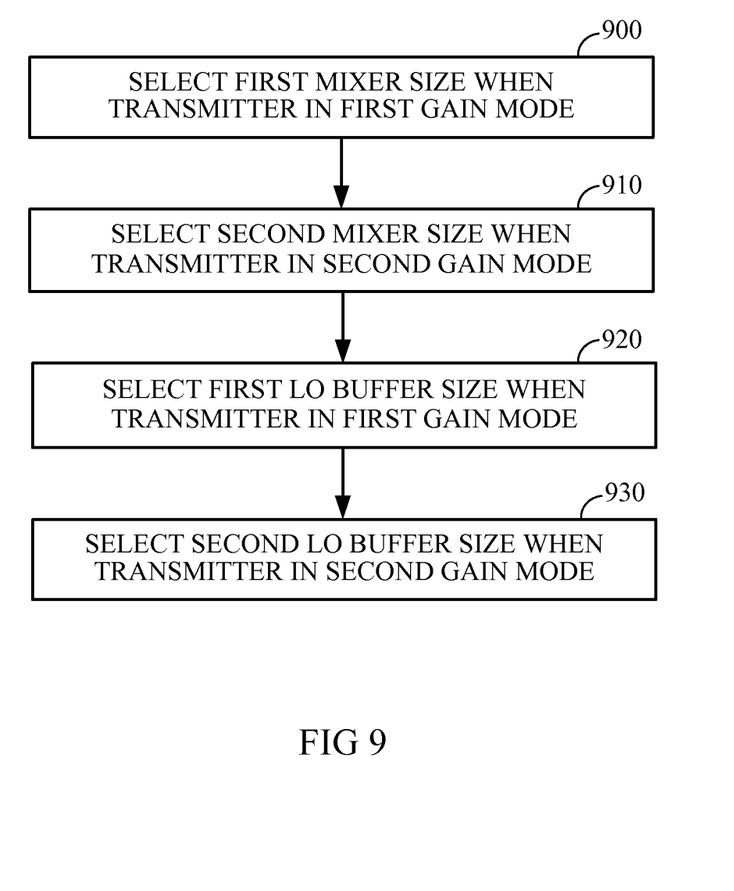
FIG. 9 depicts an exemplary method according to the present disclosure.

FIG. 9 depicts an exemplary method according to the present disclosure. Note the method is shown for illustration only, and is not meant to limit the scope of the present application to any particular method disclosed, or to any particular sequence of steps disclosed.

At step 900, the method selects a first mixer size for when the transmitter is in a first gain mode.

At step 910, the method selects a second mixer size for when the transmitter is in a second gain mode.

At step 920, the method selects a first LO buffer size when the transmitter is in the first gain mode.

At step 930, the method selects a second LO buffer size when the transmitter is in the second gain mode.

Note one of ordinary skill in the art will appreciate that the techniques described may generally be applied to both transmitter and receiver embodiments, and should not be limited only to the specific exemplary embodiments shown.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

A number of aspects and examples have been described. However, various modifications to these examples are possible, and the principles presented herein may be applied to other aspects as well. These and other aspects are within the scope of the following claims.

The invention claimed is:

1. An apparatus comprising:
a first local oscillator (LO) buffer having a first buffer size; and
a second LO buffer having a second buffer size that is larger than the first buffer size;
wherein the first LO buffer is selectively enabled via a first control signal to buffer an LO signal, and wherein the second LO buffer is selectively enabled via a second control signal to buffer the LO signal.

2. The apparatus of claim 1, further comprising:
a first mixer having a first mixer size, wherein the first mixer is coupled to receive an output of the first LO buffer; and
a second mixer having a second mixer size that is larger than the first mixer size, wherein the second mixer is coupled to receive an output of the second LO buffer;
wherein the first mixer is selectively enabled via the first control signal to mix a radio frequency (RF) signal with the output of the first LO buffer, and wherein the second mixer is selectively enabled via the second control signal to mix the RF signal with the output of the second LO buffer.

3. The apparatus of claim 2, wherein the first control signal enables the first LO buffer and the first mixer during a first gain mode, and wherein the second control signal enables the second LO buffer and the second mixer during a second gain mode.

4. The apparatus of claim 3, wherein the first control signal enables the first LO buffer and the first mixer during a third gain mode, and wherein the second control signal enables the second LO buffer and the second mixer during the third gain mode.

5. The apparatus of claim 4, wherein the first gain mode corresponds to a RF device having a first gain, wherein the second gain mode corresponds to the RF device having a second gain that is larger than the first gain, and wherein the third gain mode corresponds to the RF device having a third gain that is larger than the second gain.

6. The apparatus of claim 5, wherein the RF device is a receiver.

7. The apparatus of claim 5, wherein the RF device is a transmitter.

8. The apparatus of claim 2, wherein the RF signal is a differential signal having an in-phase component and a quadrature component.

9. The apparatus of claim 2, wherein the first mixer comprises a first transistor having a first width, and wherein the second mixer comprises a second transistor having a second width that is larger than the first width.

10. The apparatus of claim 2, wherein the second mixer size is two times the first mixer size.

11. The apparatus of claim 1, wherein the first LO buffer comprises a first transistor having a first width, and wherein the second LO buffer comprises a second transistor having a second width that is larger than the first width.

12. The apparatus of claim 1, wherein the second buffer size is two times the first buffer size.

13. The apparatus of claim 1, wherein the LO signal is a differential signal having an in-phase component and a quadrature component.

14. A method comprising:
selectively enabling a first local oscillator (LO) buffer having a first size, wherein the first LO buffer is enabled based on a first control signal; and
selectively enabling a second LO buffer having a second buffer size that is larger than the first buffer size, wherein the second LO buffer is enabled based on a second control signal.

15. The method of claim 14, further comprising:
selectively enabling a first mixer having a first mixer size, wherein the first mixer is coupled to receive an output of the first LO buffer, and wherein the first mixer is enabled based on the first control signal; and
selectively enabling a second mixer having a second mixer size that is larger than the first mixer size, wherein the second mixer is coupled to receive an output of the second LO buffer, and wherein the second mixer is enabled based on the second control signal.

16. The method of claim 15, wherein the first mixer comprises a first transistor having a first width, and wherein the second mixer comprises a second transistor having a second width that is larger than the first width.

17. The method of claim 15, wherein the first control signal enables the first LO buffer and the first mixer during a first gain mode, and wherein the second control signal enables the second LO buffer and the second mixer during a second gain mode.

18. The method of claim 17, wherein the first control signal enables the first LO buffer and the first mixer during a third gain mode, and wherein the second control signal enables the second LO buffer and the second mixer during the third gain mode.

19. The method of claim 18, wherein the first gain mode corresponds to a RF device having a first gain, wherein the second gain mode corresponds to the RF device having a second gain that is larger than the first gain, and wherein the third gain mode corresponds to the RF device having a third gain that is larger than the second gain.

20. The method of claim 19, wherein the RF device is a receiver or a transmitter.

21. The method of claim 14, wherein the first LO buffer comprises a first transistor having a first width, and wherein the second LO buffer comprises a second transistor having a second width that is larger than the first width.

22. An apparatus comprising:
first means for buffering a local oscillator (LO) signal, wherein the first means for buffering has a first size; and
second means for buffering the LO signal, wherein the second means for buffering has a second size that is larger than the first size;
wherein the first means for buffering is selectively enabled via a first control signal, and
wherein the second means for buffering is selectively enabled via a second control.

23. The apparatus of claim 22, further comprising:
first means for mixing a radio frequency (RF) signal with an output of the first means for buffering; and
second means for mixing the RF signal with an output of the second means for buffering;
wherein the first means for mixing is selectively enabled via the first control signal, and
wherein the second means for mixing is selectively enabled via the second control signal.

24. An apparatus for selecting an aggregate transistor width associated with at least one component in a transmitter, the transmitter comprising a mixer and a local oscillator (LO) buffer, the apparatus comprising:
means for enabling a first transistor in a signal path of the mixer when the transmitter is in a first gain mode; and
means for enabling a second transistor in the signal path of the mixer when the transmitter is in a second gain mode,
wherein a first width of the first transistor is different than a second width of the second transistor.

25. The apparatus of claim 24, further comprising:
means for enabling a third transistor in a signal path of the LO buffer when the transmitter is in the first gain mode; and
means for enabling a fourth transistor in the signal path of the LO buffer when the transmitter is in the second gain mode,
wherein a third width of the third transistor is different than a fourth width of the fourth transistor.

26. The apparatus of claim 25, wherein the second LO buffer size is larger than the first LO buffer size.

27. The apparatus of claim 24, wherein the gain of the transmitter is higher in the second gain mode than in the first gain mode, and wherein an aggregate width of transistors included in the signal path of the mixer during the second gain mode is larger than an aggregate width of transistors included in the signal path of the mixer during the first gain mode.

* * * * *